United States Patent
Morse

(10) Patent No.: US 9,758,862 B2
(45) Date of Patent: Sep. 12, 2017

(54) SPUTTERING APPARATUS

(71) Applicant: Sputtering Components, Inc., Owatonna, MN (US)

(72) Inventor: Patrick Lawrence Morse, Tuscon, AZ (US)

(73) Assignee: Sputtering Components, Inc., Owatonna, MN (US)

( * ) Notice: Subject to any disclaimer, the term of this patent is extended or adjusted under 35 U.S.C. 154(b) by 539 days.

(21) Appl. No.: 14/016,693

(22) Filed: Sep. 3, 2013

(65) Prior Publication Data

US 2014/0061029 A1 Mar. 6, 2014

Related U.S. Application Data

(60) Provisional application No. 61/696,610, filed on Sep. 4, 2012.

(51) Int. Cl.
  *C23C 14/00* (2006.01)
  *C23C 14/35* (2006.01)
  *H01J 37/34* (2006.01)

(52) U.S. Cl.
  CPC .......... *C23C 14/35* (2013.01); *H01J 37/3405* (2013.01); *H01J 37/3452* (2013.01); *H01J 37/342* (2013.01); *H01J 37/345* (2013.01)

(58) Field of Classification Search
  CPC .............................. H01J 37/345; H01J 37/342
  USPC ................................................... 204/298.21
  See application file for complete search history.

(56) References Cited

U.S. PATENT DOCUMENTS

| | | |
|---|---|---|
| 5,047,131 A | 9/1991 | Wolfe |
| 5,096,562 A | 3/1992 | Boozenny |
| 5,364,518 A | 11/1994 | Hartig et al. |

(Continued)

FOREIGN PATENT DOCUMENTS

| | | |
|---|---|---|
| CN | 101545094 | 9/2009 |
| JP | 62023979 | 1/1987 |

(Continued)

OTHER PUBLICATIONS

State Intellectual Property Office, P.R. China, "First Office Action from CN Application No. 201280004692.6 mailed Jan. 21, 2015", "from Foreign Counterpart of U.S. Appl. No. 13/344,871", Jan. 21, 2015, pp. 1-10, Published in: CN.

(Continued)

*Primary Examiner* — Timon Wanga
(74) *Attorney, Agent, or Firm* — Fogg & Powers LLC

(57) ABSTRACT

One embodiment is directed to a magnetron assembly comprising a plurality of magnets, and a yoke configured to hold the plurality of magnets in at least four straight, parallel, independent linear arrays. The plurality of magnets is arranged in the yoke so as to form a pattern comprising an outer portion and an inner portion, wherein the outer portion substantially surrounds the perimeter of the inner portion. The end portions of the linear array comprise a pair of turnaround sections, wherein each turnaround section substantially spans respective ends of the pair of elongated sections of the outer portion. The magnets in each turnaround section are arranged to form at least two or more different curves in the magnetic field that are offset from each along the target rotation axis.

20 Claims, 12 Drawing Sheets

(56) References Cited

U.S. PATENT DOCUMENTS

| | | | |
|---|---|---|---|
| 5,427,665 A * | 6/1995 | Hartig | C23C 14/0068 |
| | | | 204/192.12 |
| 5,814,195 A | 9/1998 | Lehan et al. | |
| 6,264,803 B1 * | 7/2001 | Morgan | H01J 37/3405 |
| | | | 204/192.12 |
| 6,375,814 B1 | 4/2002 | De Bosscher et al. | |
| 2004/0178056 A1 | 9/2004 | De Bosscher et al. | |
| 2008/0047831 A1 | 2/2008 | Richert et al. | |
| 2009/0139853 A1 | 6/2009 | Yamamoto et al. | |
| 2010/0044222 A1 | 2/2010 | Miller et al. | |
| 2010/0193354 A1 | 8/2010 | Chu | |
| 2010/0200395 A1 * | 8/2010 | Dietrich | C23C 14/0042 |
| | | | 204/192.15 |
| 2010/0300877 A1 | 12/2010 | Nadel et al. | |
| 2012/0175251 A1 | 7/2012 | Crowley et al. | |
| 2012/0261253 A1 * | 10/2012 | Madocks | C23C 14/3407 |
| | | | 204/192.1 |

FOREIGN PATENT DOCUMENTS

| | | |
|---|---|---|
| JP | H10121236 | 5/1998 |
| JP | H11500490 | 1/1999 |
| JP | 2001164362 | 6/2001 |
| JP | 2006016634 | 1/2006 |
| KR | 1019927002436 | 9/1992 |
| KR | 1020080085893 | 9/2008 |
| WO | 9107521 | 5/1991 |
| WO | 9621750 | 7/1996 |
| WO | 2011056581 | 5/2011 |

OTHER PUBLICATIONS

Japanese Patent Office, "Office Action from JP Application No. 2013-548564 mailed Aug. 27, 2015", "from Foreign Counterpart of U.S. Appl. No. 13/344,871", Aug. 27, 2015, pp. 1-6, Published in: JP.

U.S. Patent and Trademark Office, "Advisory Action", "from U.S. Appl. No. 13/344,871", Apr. 10, 2014, pp. 1-2, Published in: US.

International Preliminary Examining Authority, "International Preliminary Report on Patentability", "from Foreign Counterpart of U.S. Appl. No. 13/344,871", Jul. 18, 2013, pp. 1-5, Published in: WO.

International Searching Authority, "International Search Report and Written Opinion", Mailed Aug. 22, 2012, pp. 1-8, Published in: WO.

U.S. Patent and Trademark Office, "Notice of Allowance", "from U.S. Appl. No. 13/344,871", Jun. 24, 2014, pp. 1-12, Published in: US.

Korean Intellectual Property Office, "International Search Report and Written Opinion", "from PCT Counterpart of U.S. Appl. No. 14/016,693", Dec. 4, 2013, pp. 1-14, Published in: KR.

European Patent Office, "European Extended Search Report from European application No. 13834622.6", from foreign counterpart of U.S. Appl. No. 14/016,693, Mar. 2, 2016, pp. 1-9, Published in: EP.

State Intellectual Property Office of the People's Republic of China, "Notification to Grant Patent Right for Invention for CN Application No. 201280004692.6 mailed Sep. 29, 2015", "from Foreign Counterpart of U.S. Appl. No. 13/344,871", Sep. 29, 2015, pp. 1-5, Published in: CN.

European Patent Office, "Extended European Search Report from EP Application No. 12732335.0 mailed Dec. 1, 2015", "from Foreign Counterpart of U.S. Appl. No. 13/344,871", Dec. 1, 2015, pp. 1-12, Published in: EP.

Japanese Patent Office, "Pre-Final Office Action from JP Application No. 2013-548564 mailed Jul. 27, 2016", from Foreign Counterpart of U.S. Appl. No. 13/344,871, Jul. 27, 2016, pp. 1-6, Published in: JP.

State Intellectual Property Office, P.R. China, "First Office Action from CN Application No. 201380046219.9 mailed Jun. 13, 2016", from Foreign Counterpart of U.S. Appl. No. 14/016,693, Jun. 13, 2016, pp. 1-19, Published in: CN.

Taiwan Intellectual Property Office, "Search Report of Patent Application No. 102131641", Foreign counterpart to U.S. Appl. No. 14/016,693, Feb. 15, 2017, pp. 1-12, Published in: TW.

European Patent Office, "Article 94(3) EPC", Foreign Counterpart to U.S. Appl. No. 13/344,871, Jan. 3, 2017, pp. 1-7, Published in: EP.

Japanese Patent Office, "Notice of Allowance for JP Application No. 2013-548564", from Foreign Counterpart to U.S. Appl. No. 13/344,871, Feb. 24, 2017, pp. 1-4, Published in: JP.

State Intellectual Property Office of the People's Republic of China, "Notification to Grant Patent Right for Invention", Foreign Counterpart to U.S. Appl. No. 14/016,693, Feb. 6, 2017, pp. 1-7, Published in: CN.

* cited by examiner

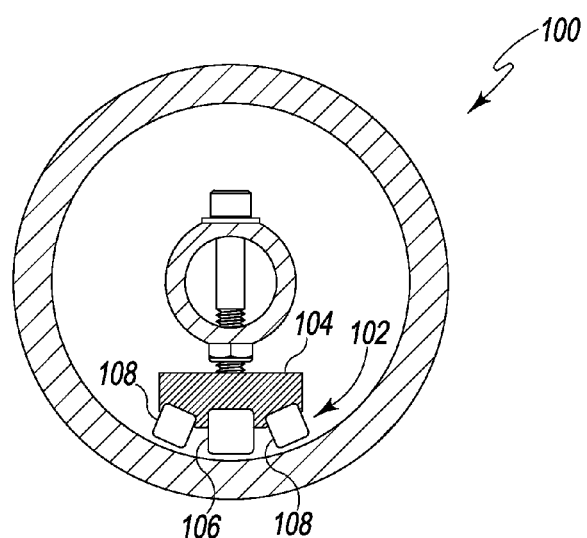
Fig. 1A
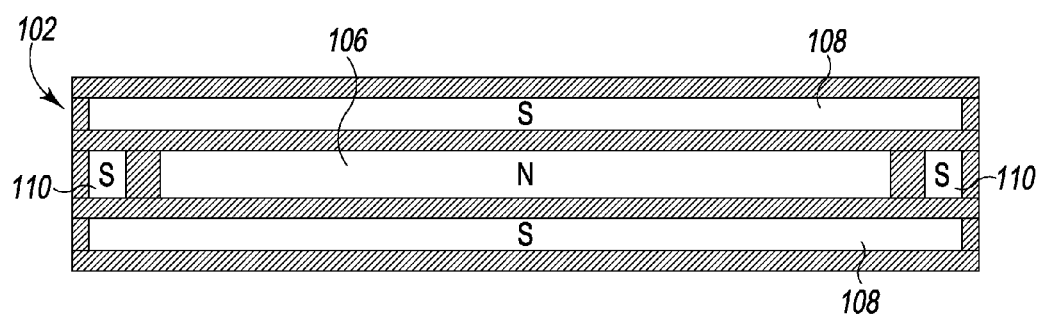
RESULTING SPUTTER PATTERN
Fig. 1B

DIFFERENT GEOMETRY MAGNETS
DIFFERENT SIZED MAGNETS
DIFFERENT STRENGTH MAGNETS

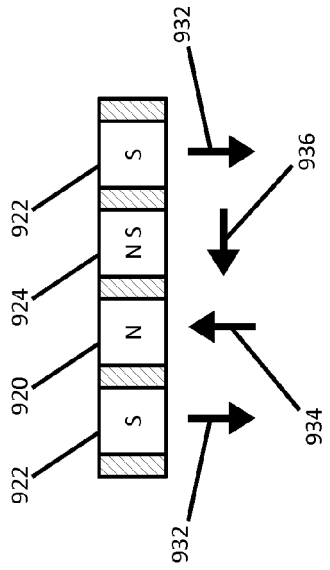
FIG. 10-A
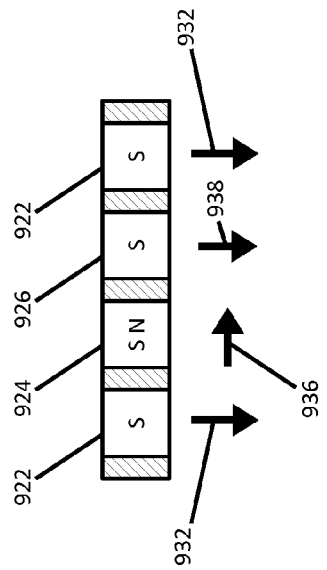
FIG. 10-B
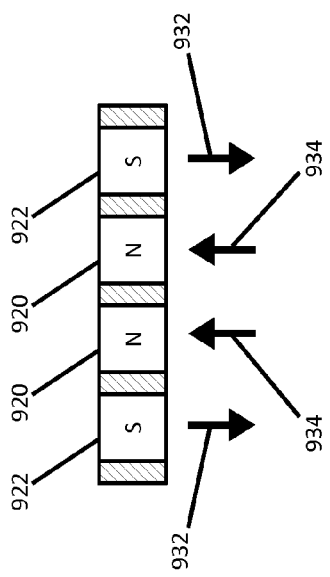
FIG. 10-C
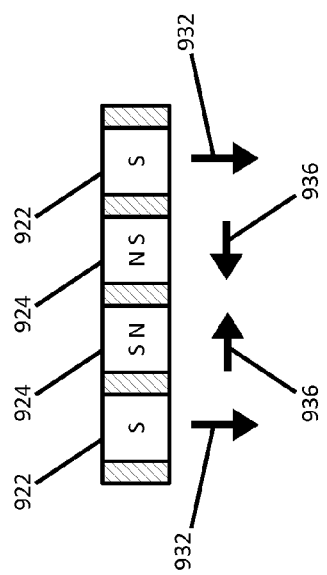
FIG. 10-D

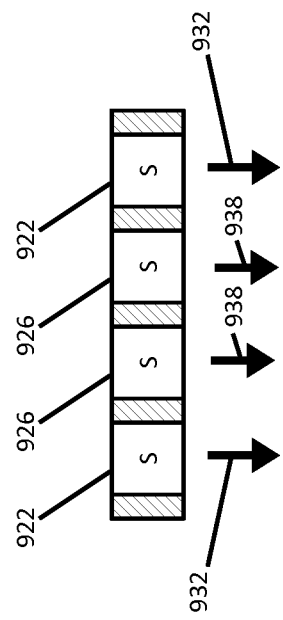
FIG. 10-E

SPUTTERING APPARATUS

CROSS-REFERENCE TO RELATED APPLICATIONS

This application claims the benefit of U.S. Provisional Patent Application Ser. No. 61/696,610, filed on Sep. 4, 2012, which is hereby incorporated herein by reference.

This application is related to U.S. Provisional Patent Application Ser. No. 61/430,361, filed Jan. 6, 2011 and U.S. patent application Ser. No. 13/344,871, filed Jan. 6, 2012, both of which are hereby incorporated herein by reference.

TECHNICAL FIELD

This description generally relates to rotating-cathode magnetron sputtering. In particular, it deals with certain problems encountered when the target material is increased beyond the point where standard magnetron assemblies can supply adequate magnetic flux suitable for magnetron sputtering. Additionally, some embodiments of the present invention improve process conditions for the deposition of such materials as transparent conductive oxides (TCO).

BACKGROUND

Magnetron sputtering of rotating targets is well known in the art and is used extensively for producing a wide variety of thin films on a wide variety of substrates. A reasonable overview of sputtering with rotating cathodes can be found in U.S. Pat. No. 5,096,562 (which is hereby incorporated by reference herein), as one example.

In the most basic form of rotating-target magnetron sputtering, the material to be sputtered is either formed in the shape of a tube or is adhered to the outer surface of a support tube made of rigid material. A magnetron assembly is disposed within the tube and supplies magnetic flux which permeates the target such that there is adequate magnetic flux at the outer surface of the target. The magnetic field is designed in a way such that it retains electrons emitted from the target so as to increase the probability that they will have ionizing collisions with the working gas, hence enhancing the efficiency of the sputtering process.

Fabrication cost for targets of some materials, in particular ceramic TCO materials, are relatively high in comparison to the cost of the raw materials. To improve the economy of these targets, it is desirable to increase the thickness of the target material. In this way, the target will have significantly more usable material while adding only minimally to the overall cost of the target. This is because the fabrication cost does not change significantly. The only significant increase is due to the additional raw material used. Thicker targets should have the added benefit of allowing longer production campaigns between target changes.

As mentioned, increasing the target thickness too much can result in inadequate magnetic flux at the target surface when using standard magnetron assemblies. The need for a magnetron design with higher magnetic flux is clear.

However, the effort to increase magnetic flux will usually create a new problem wherein the width of the turn-around is broadened. This, in turn, results in an increased relative erosion rate at the target ends and, therefore, a shortened target life due to target "burn-through". This is contrary to the purpose of increasing the target thickness.

SUMMARY

The typical magnetron assembly 100 (shown in FIG. 1A) for rotating cathodes comprises three substantially parallel rows 102 of magnets attached to a yoke 104 of magnetically conductive material, such as steel, that helps complete the magnetic circuit. The direction of magnetization of the magnets will be radial with respect to the major axis of the sputtering target. The center row 106 will have the opposite polarity of the two outer rows 108. (see FIG. 1B) Additional description of this type of magnetron can be found in U.S. Pat. No. 5,047,131 (which is hereby incorporated by reference herein). Magnetic flux of the inner and outer rows 106 and 108 of magnets is linked through the magnetically conductive yoke 104, on one side of the magnets. On the other side of the magnets, opposite the yoke 104, the magnetic flux is not contained in a magnetically conductive material; hence, it permeates substantially unimpeded through the target which is substantially non-magnetic. Thus, two arc-shaped magnetic fields are provided at and above the working surface of the target. This field retains the electrons and causes them to drift in a direction perpendicular to the magnetic field lines, which is parallel to the rows 102 of magnets. This is known as the E×B drift and is described in any basic plasma physics text book. In an ordinary arrangement, this drift path is also parallel to the major axis of the target.

Additionally, the outer rows 108 are slightly longer that the inner row 106 and additional magnets 110 (shown in FIG. 1B), of the same polarity as the outer rows 108, are placed at the ends of the assembly between the two outer rows 108 creating the so-called "turn-around" areas of the drift path. This has the effect of connecting the two drift paths, hence forming one continuous ovular "racetrack" drift path. This optimizes the retention of the electrons and therefore optimizes the efficiency of the sputtering process.

The intuitive route to increasing the field strength is simply to increase the size or the strength of the magnets. Increasing the magnetic strength is limited by availability of stronger magnets. Very high strength magnets are also very expensive, and difficult to work with. Furthermore, stronger magnets could also be applied to any superior design for added benefit such as those of the embodiments of the present invention.

Problems arise when considering magnets of larger cross-section. Increasing the dimension in the radial direction does not give a proportional increase in flux at the target surface. As such, this is a self-limiting approach. Increasing the dimension in the direction tangent to the target surface is also self limiting in that the geometry requires moving the bulk of the magnetic material further from the target surface, which serves to weaken the field at the target surface. This is contrary to achieving the desired effect. (see FIG. 2 for one example of such a design)

Another detrimental effect to the approach of increasing the magnet size is that the racetrack is widened. That is to say, the two long portions of the racetrack are separated further from each other. This broadens the turn-around portions of the racetrack leading to an increased relative erosion rate at the ends of the targets. Consequently, these portions of the target are spent before using the greater bulk of the target material. Hence, the target must be taken out of service before fully using the target material.

To understand the increased erosion rate at the ends, one can consider two points on the rotating target surface. One point rotates through the two legs (long portions) of the racetrack. The other point rotates through the turn-around. It will be seen that the point going through the turn-around spends much more time in the racetrack, hence is more heavily eroded. Further discussion of this topic can be found in U.S. Pat. No. 5,364,518 (which is hereby incorporated by reference herein).

The problems described above can be overcome by using four (or more) rows or other independent linear arrays of magnets, instead of the usual 3 rows. This allows the problem of oversized magnets as previously discussed to be overcome. More importantly, though, it allows for a unique modification to the turn-around that minimizes the excessive erosion at the ends of the target without negatively impacting (or at least reducing the negative impact) to the retention of electrons.

One embodiment is directed to a magnetron assembly comprising a plurality of magnets, and a yoke configured to hold the plurality of magnets in at least four straight, parallel, independent linear arrays. The plurality of magnets is arranged in the yoke so as to form a pattern comprising an outer portion and an inner portion, wherein the outer portion substantially surrounds the perimeter of the inner portion. The end portions of the linear array comprise a pair of turnaround sections, wherein each turnaround section substantially spans respective ends of the pair of elongated sections of the outer portion. The magnets in each turnaround section are arranged to form at least two or more different curves in the magnetic field that are offset from each along the target rotation axis.

Another embodiment is directed to a sputtering system comprising a chamber through which a substrate moves. The system also comprises a cathode assembly that includes an elongated rotatable cylindrical tube mounted in the chamber and having a target surface and a magnetron assembly positioned within the elongated rotatable cylindrical tube. The magnetron assembly comprises a plurality of magnets and a yoke configured to hold the plurality of magnets in at least four straight, parallel, independent linear arrays. The plurality of magnets is arranged in the yoke so as to form a pattern comprising an outer portion and an inner portion, wherein the outer portion substantially surrounds the perimeter of the inner portion. The end portions of the linear array comprise a pair of turnaround sections, wherein each turnaround section substantially spans respective ends of the pair of elongated sections of the outer portion. The magnets in each turnaround section are arranged to form at least two or more different curves in the magnetic field that are offset from each along the target rotation axis.

Another embodiment is directed to a method of sputtering material on a substrate. The method comprises forming a pattern of magnets as a part of a magnetron assembly disposed within an elongated rotatable cylindrical tube, wherein the elongated rotatable cylindrical tube comprises a target surface. The method further comprises mounting the elongated rotatable cylindrical tube in a chamber, maintaining a vacuum in the chamber, rotating the elongated rotatable cylindrical tube within the chamber, supplying a magnetic flux at the target surface using the magnetron assembly, and moving the substrate within the chamber near the target surface. The magnetron assembly comprises a plurality of magnets and a yoke configured to hold the plurality of magnets in at least four straight, parallel, independent linear arrays. The plurality of magnets is arranged in the yoke so as to form a pattern comprising an outer portion and an inner portion, wherein the outer portion substantially surrounds the perimeter of the inner portion. The end portions of the linear array comprise a pair of turnaround sections, wherein each turnaround section substantially spans respective ends of the pair of elongated sections of the outer portion. The magnets in each turnaround section are arranged to form at least two or more different curves in the magnetic field that are offset from each along the target rotation axis.

DRAWINGS

FIG. 1A is a diagram of a typical magnetron assembly for rotating cathodes.

FIG. 1B illustrates the direction of magnetization of the magnets in the magnetron assembly of FIG. 2A.

Figure 9:
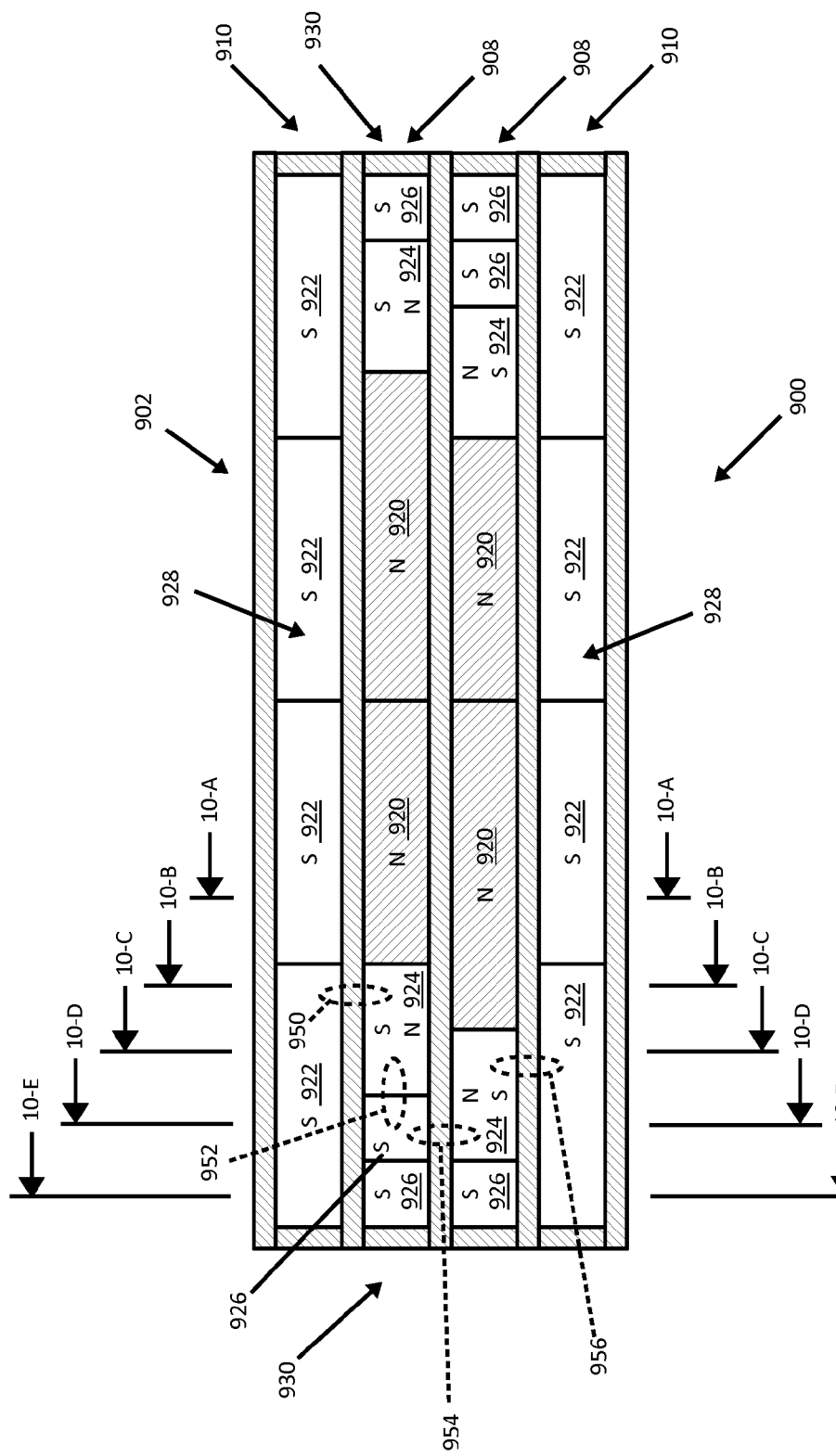
FIG. 9 illustrates another exemplary magnet arrangement suitable for use in the magnetron assemblies described here.

FIGS. 10-A through 10-E illustrate cross-sections of the exemplary magnet arrangement shown in FIG. 9 taken across lines 10-A through 10-E, respectively.

Figure 11:
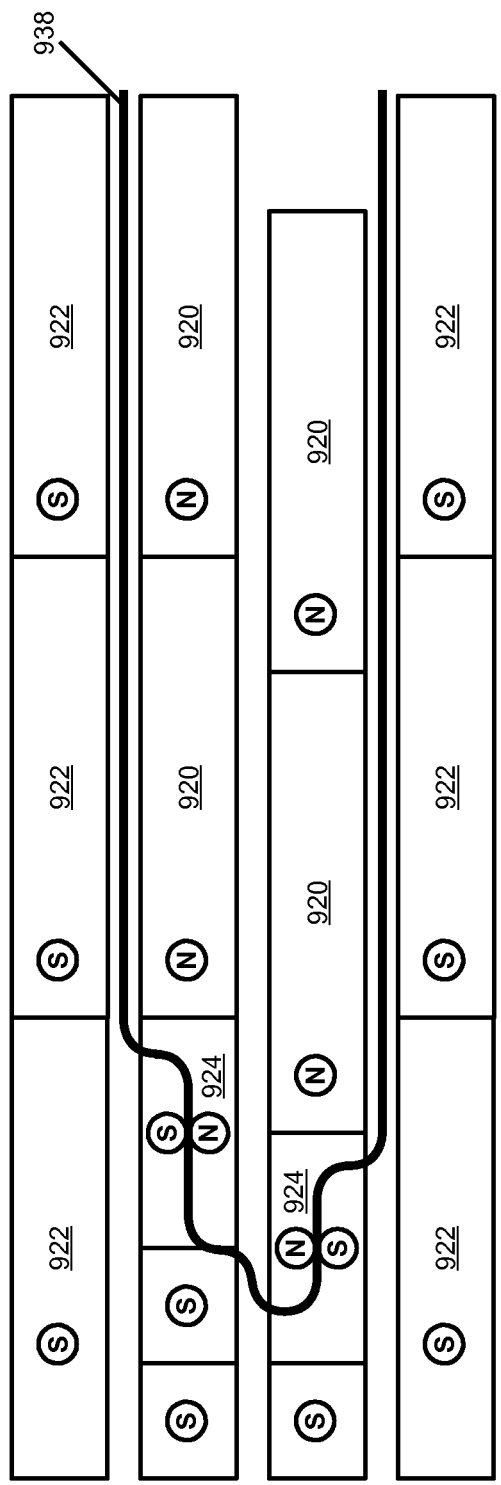

FIG. 11 illustrates a plasma formed using the magnet arrangement shown in FIG. 9.

Figure 12:
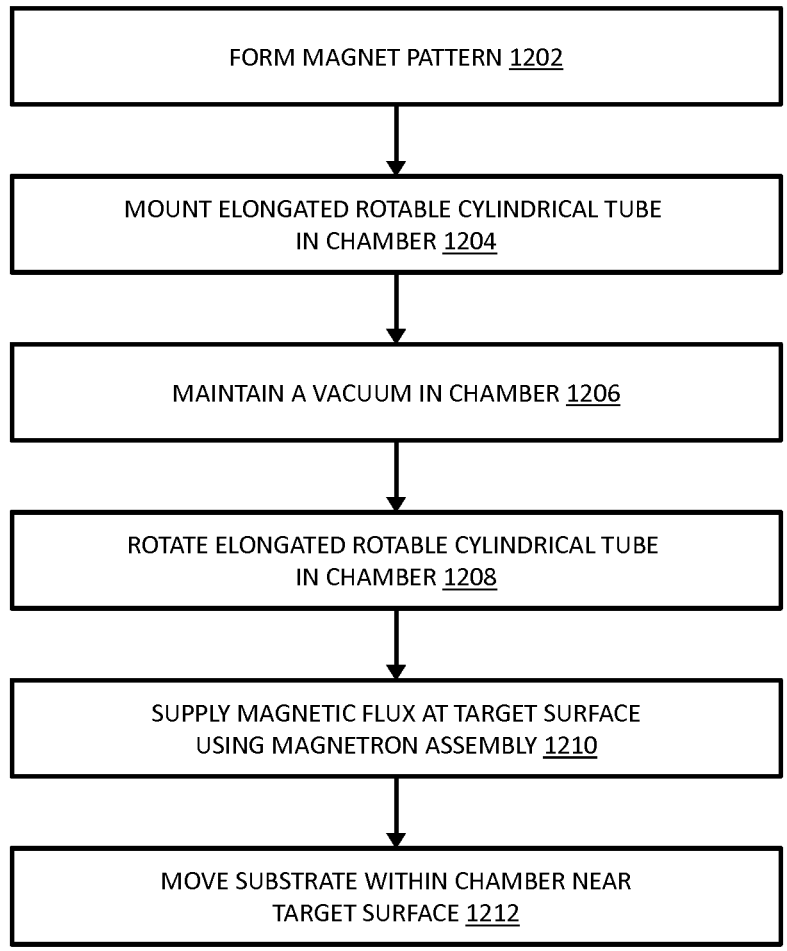

FIG. 12 is a flow diagram of one exemplary embodiment of a method of sputtering material on a substrate.

DETAILED DESCRIPTION

Figure 2:
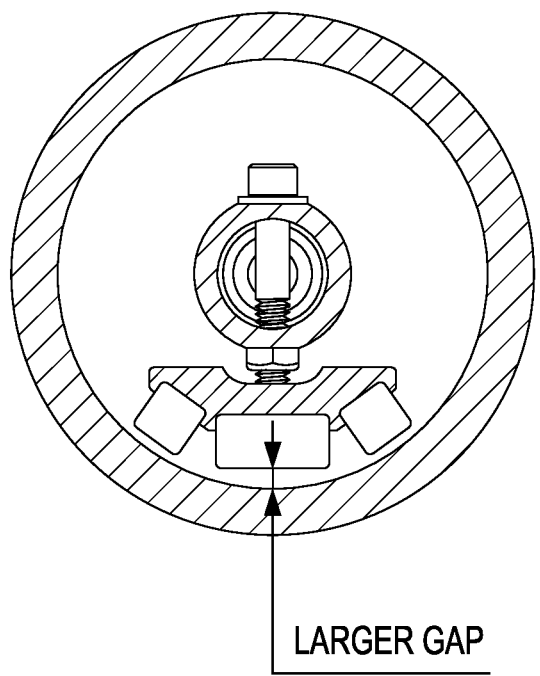
FIG. 2 is a diagram of an alternative design of a magnetron assembly for rotating cathodes.
Figure 3A:
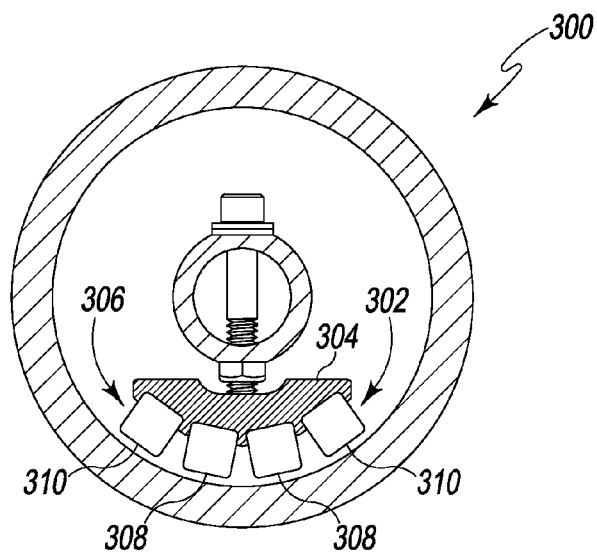
FIG. 3A is a diagram of one exemplary embodiment of a magnetron assembly.

Referring to FIG. 3A, in one exemplary embodiment of the present invention, a magnetron assembly 300 comprises a plurality of magnets 302 and a yoke 304 configured to hold the plurality of magnets 302 in at least four straight, parallel, independent linear arrays 306. In the exemplary embodiment shown in FIG. 3A, the magnetron assembly 300 comprises four straight, parrallel, independent linear arrays 306 of magnets 302 that are arranged in four rows 306.

In this exemplary embodiment, the magnet rows 306 comprise two inner rows 308 of one polarity and two outer rows 310 of the opposite polarity. The rows 306 of magnets 302 are attached to the yoke 304. The yoke 304 is made of magnetically conductive material, such as steel or magnetic stainless steel. This configuration allows additional magnetic mass while allowing the magnets 302 to remain at the closest position relative to the target surface as is feasible. Thus, full advantage is taken of the extra magnetic mass.

Figure 3B:
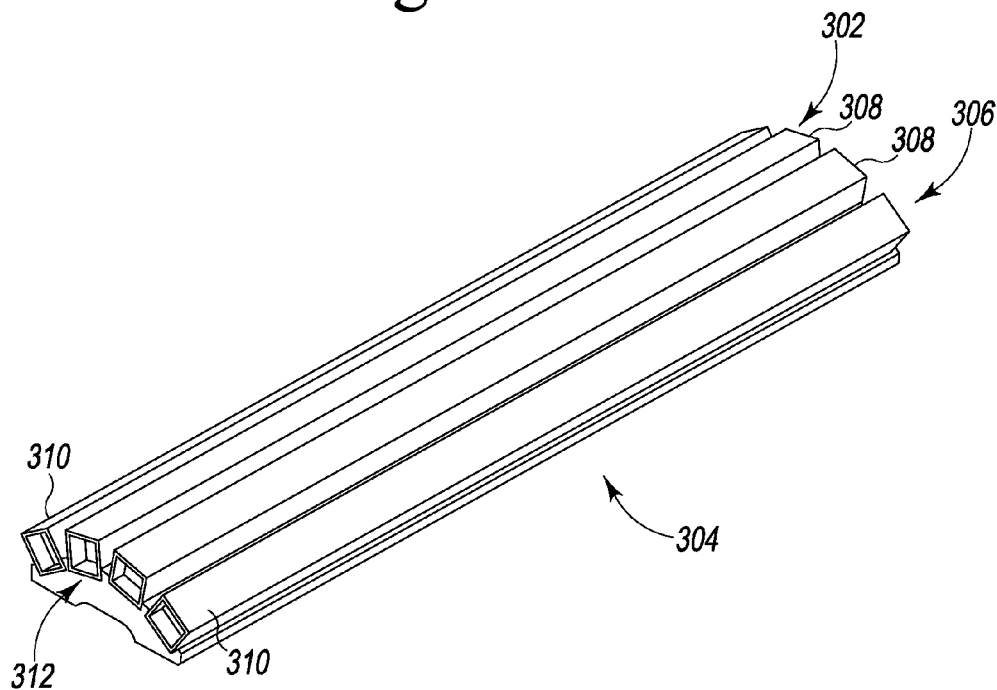
FIG. 3B is a diagram of one exemplary embodiment of a yoke used in the magnetron assembly of FIG. 3A.

As shown in FIG. 3B, in one embodiment, the yoke 304 comprises a plurality of slits or channels 312, one for each of the rows 306 of magnets 302. (It is noted that, for the sake of simplicity, the details regarding the particular magnet arrangement is not shown in FIG. 3B and, instead, are discussed in more detail below in connection with FIGS. 4-6.) The channels 312 are sized so that a portion of the corresponding magnets 302 can be inserted into the channels 312 in order to form the rows 306 of magnets 302 described and shown here. The magnets 302 can be held in place in several ways including, without limitation, using magnet force, friction fit, or adhesives. The use of such channels 312 to form the magnet patterns described here enables the overall magnetron assembly 300 to be reconfigurable without modification to the design of the yoke 304.

In the preferred embodiment, the inner rows and outer rows 308 and 310 of magnets 302 have the same strength and the same cross-sectional dimensions such that the assembly is a "balanced magnetron". However, one may optionally place dissimilar magnets in the inner and outer rows 308 and 310 to make "unbalanced" magnetrons.

Figure 4:
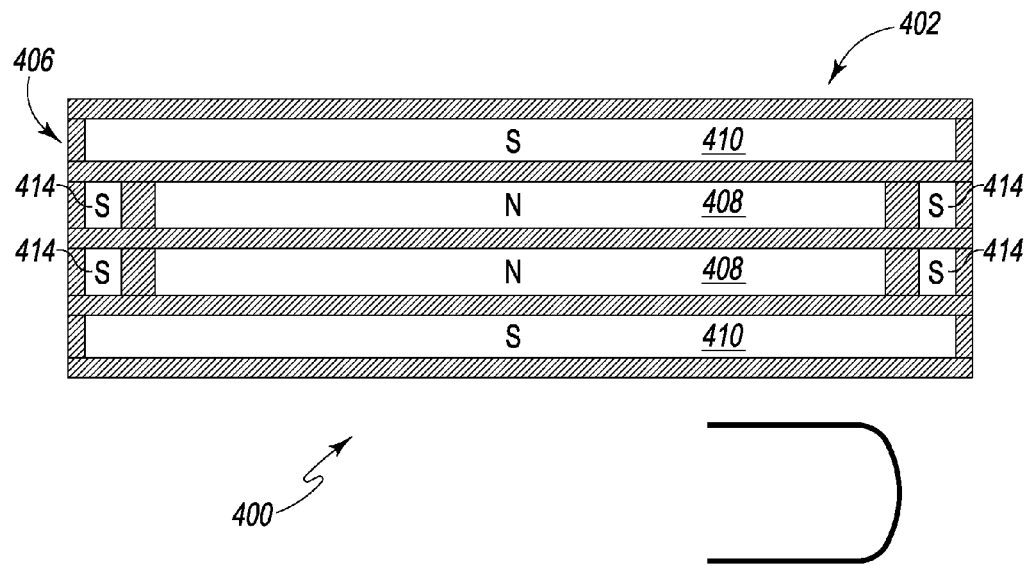
FIG. 4 illustrates one exemplary magnet arrangement suitable for use in the magnetron assembly of FIG. 3A.

FIG. 4 illustrates one exemplary magnet arrangement 400 suitable for use in the magnetron assembly 300 of FIG. 3A. In this exemplary magnet arrangement 400, as with the standard three-row design, the outer rows 410 are longer than inner rows 408 thus providing space for the end magnets 414 used to create the turn-around portions of the racetrack. As depicted, the turn-around-forming magnets 414 are of the same cross section dimensions as that of the magnets of the inner rows 408 and are displaced collinearly with the inner rows 408. The turn-around-forming magnets 414 are, however, of the same polarity as the outer rows 410. This design lends itself to easy modifications of the turn-around areas which will result in more preferred embodiments.

Figure 5:
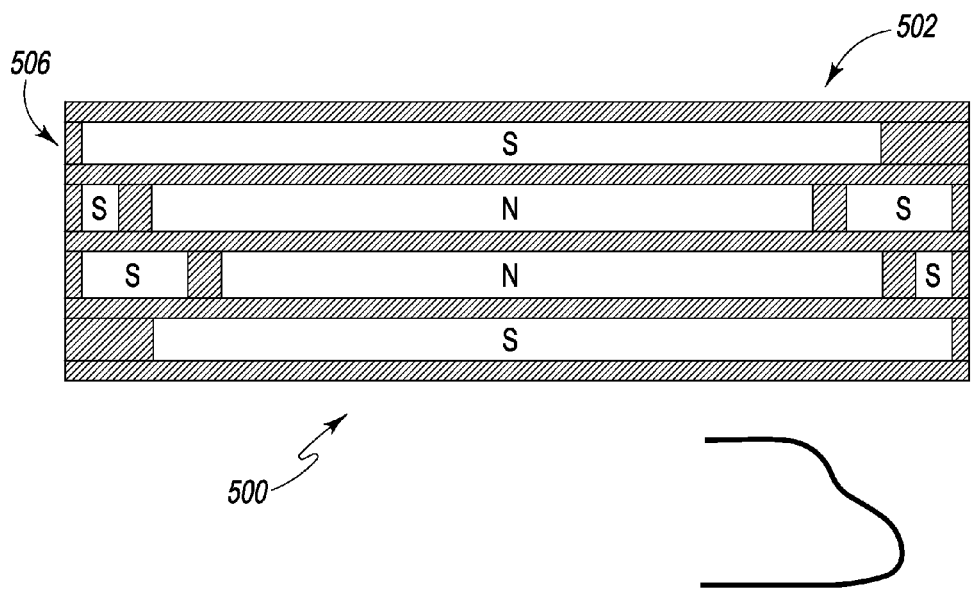
FIG. 5 illustrates another exemplary magnet arrangement suitable for use in the magnetron assembly of FIG. 3A.

FIG. 5 illustrates another exemplary magnet arrangement 500 in which the rows 506 of magnets 502 are laterally offset from each other. This results in a stepped turn-around wherein the actual turn-around is reduced in radius to that of a standard three-row magnetron design. Hence, the target-end erosion rate is not increased beyond that of the standard design, as would be the case of a three-row design with larger magnets. As with the turn-around, the residual step in the drift path, created by this configuration, will produce another area of elevated erosion rate. However, since this area is offset from the turn-around and will not erode any faster than the turn-around area, it will not contribute to premature target burn-through.

Figure 6:
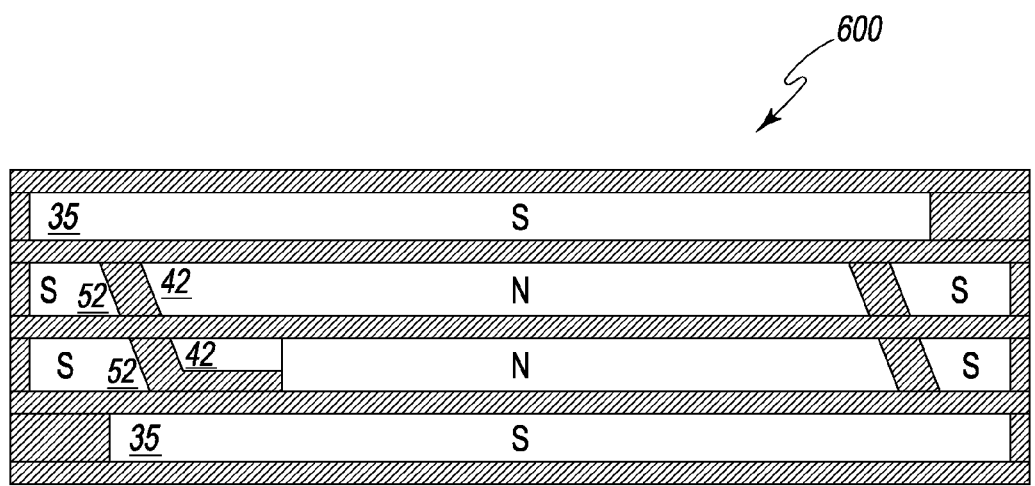
FIG. 6 illustrates yet another exemplary magnet arrangement 600 suitable for use in the magnetron assembly of FIG. 3A.

Although FIG. 5 shows one preferred exemplary arrangement, it should be clear that the design lends itself to any number of permeations that may be useful in other circumstances. For example, magnets having differing magnet strengths, shapes, geometries, sizes, orientations, and differing gap spacing between the rows can also be implemented. One such exemplary magnet arrangement 600 is shown in FIG. 6, though it is to be understood that other arrangements are possible.

Figure 7:
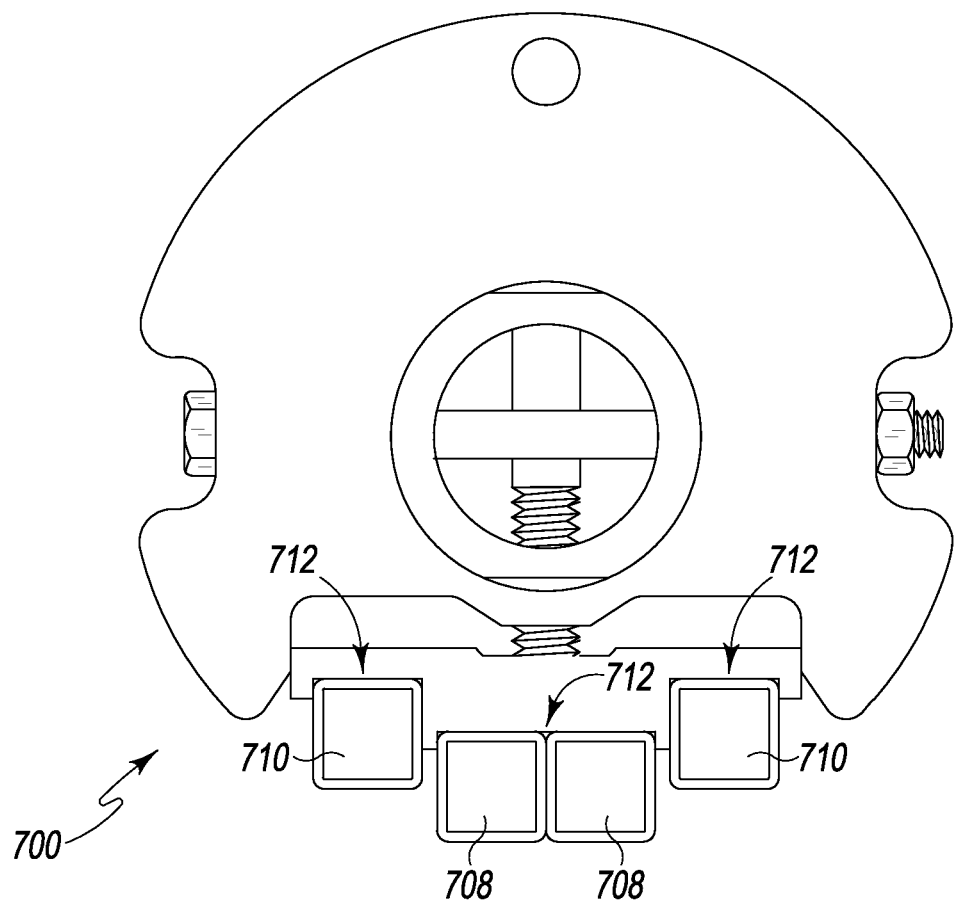
FIG. 7 is a diagram of another exemplary embodiment of a magnetron assembly.

Moreover, in the embodiments shown in FIGS. 3A, 3B, and 4-6, each row of magnets is inserted into a different, respective channel that is formed in the yoke. However, in other embodiments, more than one row (or other independent linear array) of magnets can be housed within a single channel. One example of such an embodiment is shown in FIG. 7. In the example shown in FIG. 7, both of two inner rows 708 of magnets 702 are housed within a common, single channel 712, while each of two outer rows 710 of magnets 702 are housed within separate, respective channels 712.

Although embodiments of the present invention are intended to improve target economics by allowing thicker target material, it can be beneficial to targets of more ordinary material thickness. Because the magnetic field strength is increased, the ionization potential of the electrons is increased by decreasing the electrons radii of gyration and allowing larger electron density in the plasma, which improves electron retention. This results in lower target voltage, which is advantageous when depositing some materials such as TCO. It is well known in the art that lower target voltage in TCO sputter deposition processes results in improved performance of the deposited film.

Another four-row magnetron design is disclosed in U.S. Pat. No. 5,364,518. However, the intent with the design in the '518 patent is to allow easier manipulation of the turn-around in another style. In the '518 patent, the intent was to modify the turn-around by widening the magnetic field relative to the major legs of the racetrack by increasing the distance between magnets. It is not clear if the invention disclosed in U.S. Pat. No. 5,364,518 is feasible, or if it has ever been assembled and tested in the real world. In U.S. Pat. No. 6,375,814 (which is hereby incorporated by reference herein) it is suggested that the invention of the '518 patent will lead to instability in the sputtering process.

U.S. Pat. No. 6,375,814 also refers to a four-row design. However, as depicted, the two inner rows replace a single center row only as a convenience which helps separate the two major legs of the racetrack for the purpose of forming an elliptical shaped turn-around or for manipulating sputtering direction. In practical terms, the '814 patent design can use a single row of magnets for a majority of the length of the assembly.

Embodiments of the present invention have the further advantage over the '814 patent in that it can be completely assembled from different lengths of magnets with the same simple rectangular geometry and a very simple yolk design. Whereas the elliptical assembly of the '814 patent requires a complicated yolk and, in the preferred embodiment, specially designed and manufactured magnets. Furthermore, once assembled, the design of at least some embodiments of the present invention can be easily modified, but the design of the '814 patent is fixed and cannot be modified without complete remanufacturing.

U.S. Pat. No. 6,264,803 (which is hereby incorporated by reference herein) discloses a magnetron with five parallel rows of magnets that form two complete, parallel racetracks. It does not have the benefit of the stronger magnetic field of embodiments of the present invention. However, the '803 patent invention offsets the two racetracks to achieve a similar advantage of the stepped turn-around as with embodiments of the present invention.

The single, continuous race-track of embodiments of the present invention has important advantages over the dual racetrack design of the '803 patent. In the dual racetrack design the space between the outer-most legs are spaced farther apart from each other around, the circumference of the target, as compared to a single racetrack design. This changes the relative angle between the effluxes of sputtered material to plane of the substrate. This increases the average angle of incidence of material being deposited on the substrate. This affects the structure of the deposited film, such as by reducing molecular density, often to an unacceptable degree. In the case of TCO films, density is of great importance.

Another unfortunate result of the design in the '803 patent is that a substantially larger portion of the sputtered material is deposited on the walls of the process chamber and, hence, less of the material is used in making the desired film. This can be reduced or eliminated with some embodiments of the present invention.

Whereas the angle between outer legs of the racetrack of the '803 patent design is about three times that of a standard three row design, the angle between the legs of the design of some embodiments of the present invention is less than twice that of the standard design.

Figure 8:
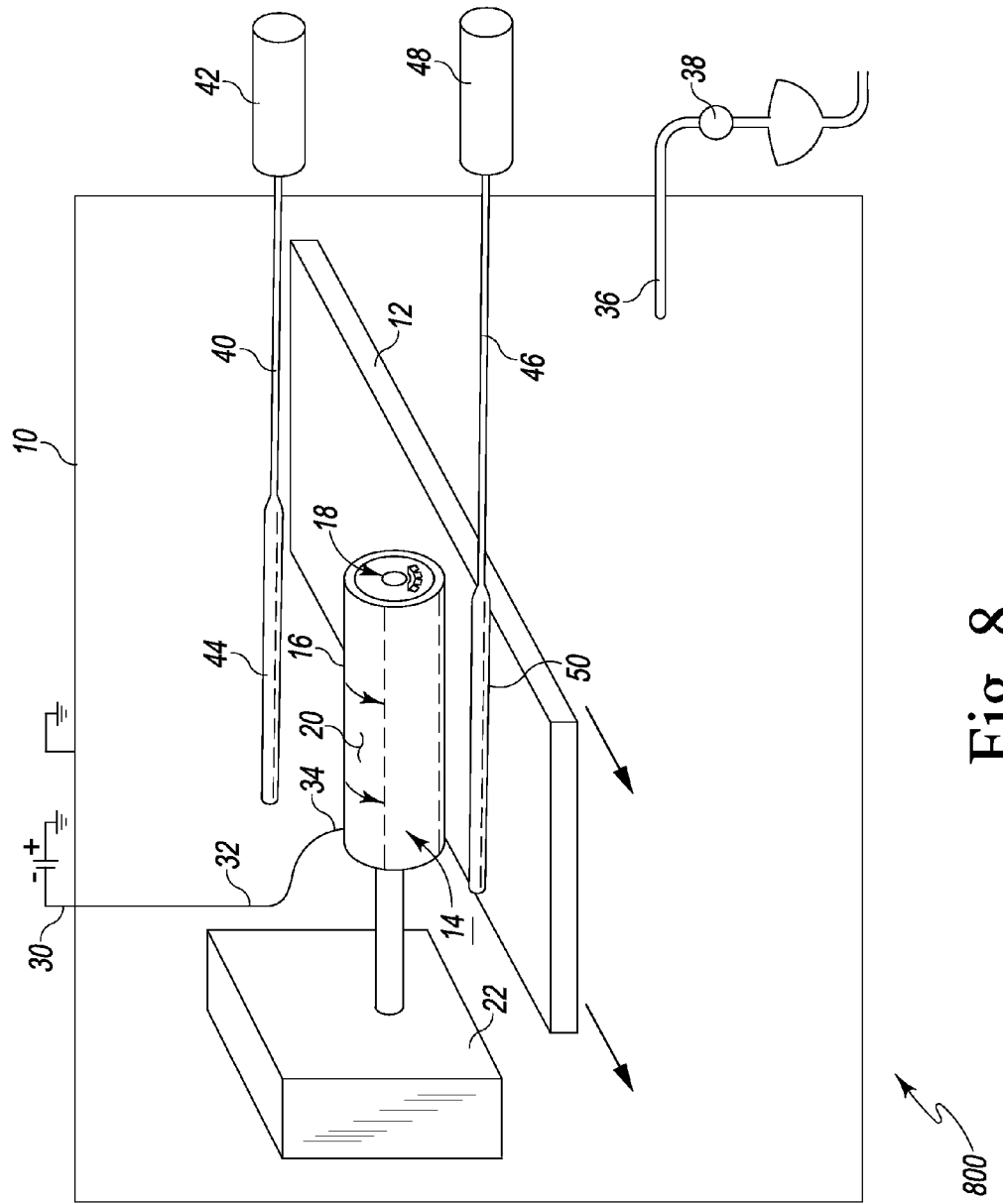
FIG. 8 is a diagram of one exemplary embodiment of a sputtering system in which the magnetron assemblies of FIG. 3A and FIG. 7 can be used.

FIG. 8 illustrates one exemplary embodiment of a sputtering system 800 in which the magnetron assemblies 300 and 700 described above can be used. The exemplary embodiment of a sputtering system 800 shown in FIG. 8 is substantially similar to the sputtering system shown in FIG. 1. of U.S. Pat. No. 5,096,562 (which is hereby incorporated herein by reference) and described in column 2, line 55—column 4, line 23 of the '562 patent, with the main difference being the use of a magnetron assembly 18 of the type described above in which at least four rows (other independent linear arrays) of magnets are attached to or otherwise held in a yoke.

A plasma is formed within an enclosed reaction chamber 10, in which a vacuum is maintained, for the purpose of depositing a thin film of material on a substrate 12 as it moves through the chamber 10. The substrate 12 can be most anything that will accept the film to be deposited on it, and is usually some vacuum compatible material, such as metal, glass, and some plastics. The film can also be deposited over other films or coatings that have previously been formed on a substrate surface.

A cathode assembly 14 comprises generally an elongated rotatable cylindrical tube 16, mounted in the reaction chamber 10, and having a target surface 20. A magnetron assembly 18 of the type described above is carried within a lower portion of the tube 16 and does not rotate with it. The inside of the tube 16 is typically water cooled, as described later, in order to allow the system to operate at high electrical power levels. The tube 16 is supported in a horizontal position and is rotated by a drive system 22 at a constant speed about its longitudinal axis.

The tube 16 may be constructed in one of many different forms, depending upon the nature and composition of the target material to be exposed on the outside cylindrical surface 20. One structure has walls made substantially entirely of solid target material. Another structure is formed of a core of suitable nonmagnetic material such as, for example, brass or stainless steel, and is of a diameter, wall thickness and length required for a particular operation to be performed. Applied to the outer surface of the core is a layer of a selected target material 20 to be deposited onto the substrate 12 being coated. In either case, the tube 16 and layer of target material 20 constitute a tubular target or sputtering source in place of a more conventional planar target.

A cathode potential sufficient to cause sputtering to occur is supplied to the rotating cathode 14 from a power source 30 through a power line 32 having sliding contact 34 with the tube 16 by a conventional electrical brush. The power source 30 is of a direct current type in the example being described but alternating current power sources can also be used in such structures. The enclosure of the reaction chamber 10 is conductive and electrically grounded. It serves as an anode in the sputtering process. A separate anode may be optionally employed and maintained at a small positive voltage.

In order to obtain the low pressure necessary for the coating operation to be performed, the reaction chamber 10 is provided with an outlet tube 36 communicating with a vacuum pump 38.

In order to provide the chamber 10 with the gases necessary for the coating operation, a gas supply system is included. A first gas supply tube 40 extends into the coating chamber 10 from a source 42 of an inert gas. Nozzles 44 connected to inlet tube 40 distribute the inert gas in a region above the rotating cathode 14. It is the inert gas that breaks down into electrically charged ions under the influence of an electric field established between the target surface 20 and the grounded chamber enclosure 10. The positive ions are attracted to and bombard the target surface 20 in an area to which they are confined by the magnetic field, primarily in two parallel strips, one between each of the opposing magnetic poles, along the length of the cylinder 16 at its bottom, opposite the magnet assembly 18.

A second gas supply tube 46 extends into the chamber 10 from a reactive gas source 48. Nozzles 50 connected to inlet tube 46 distribute the reactant gas in a region close to and across the width of the substrate 12 being coated. Molecules of the reactive gas combine with molecules sputtered from the target surface, as a result of ion bombardment, to form the desired molecules that are deposited on the top surface of the substrate 12.

Many variations in the gas supply system shown are practical as well. The inert and reactive gases from the sources 42 and 48 can be combined and delivered into the chamber 10 through a common tube and set of nozzles. When this is done, the delivery tube is preferably positioned along a side of the rotating target tube 16 and parallel with its longitudinal axis. Two such tubes can be used, one on each side of the target tube 16 and parallel with its longitudinal axis, each delivering the same combination of inert and reactive gases. Also, more than one reactive gas can be simultaneously supplied, depending upon the film being deposited.

In the exemplary magnet arrangements described above, the magnetic poles for all of the magnets in each individual row (or other independent linear array) all fall within the same plane—that is, the magnetic poles for all of those magnets are co-planar. For example, in the exemplary magnet arrangement shown in FIG. 4, the outer rows 410 include only a single magnet, which necessarily has a magnetic pole that is co-planar with itself. For the inner rows 408, the magnets that are in the outer section of the pattern have their magnetic poles directed down (shown with a polarity of "S" in FIG. 4) and the magnets that are in the inner portion of the pattern have their magnetic poles directed up (shown with a polarity of "N" in FIG. 4). That is, for the inner rows 408, the magnetic poles of the magnets in the outer portion of the pattern are 180 degrees out of phase with the magnetic poles of the magnets in the inner portion of the pattern but the magnetic poles for both sets of magnets are still co-planar.

FIG. 9 illustrates another exemplary magnet arrangement 900 suitable for use in the yokes and magnetron assemblies described above. For example, the magnet arrangement 900 shown in FIG. 9 can be used in a re-configurable yoke of the type described above. Also, as with the examples shown above, the magnets 902 in the magnet arrangement 900 shown in FIG. 9 can be arranged on a yoke in various ways (for example, in a radial pattern, a stair-step pattern, or a flat pattern). Also, the exemplary magnet arrangement 900 shown in FIG. 9 can be used, for example, in the sputtering system 800 described above in connection with FIG. 8, though it is to be understood that other embodiments can be implemented in other ways.

In this exemplary magnet arrangement 900, as with the magnet arrangements 400, 500, and 600 described above in connection with FIGS. 4, 5, and 6, respectively, the magnets 902 are arranged in four straight, parrallel, independent linear arrays 906 of magnets 902. In this example, the four independent linear arrays 906 take the shape of four rows 906—comprising two inner rows 908 and two outer rows 910.

In this example, the magnets 902 are arranged so as to form a racetrack pattern comprising an outer portion (the racetrack) and an inner portion (the inside of the racetrack). The magnets 920 that are in the inner portion are shown in FIG. 9 with a cross-hatched pattern, and the magnets 922, 924, and 926 in the outside portion are shown in FIG. 9 without any hatching pattern. The magnets 920 in the inner portion are also referred to here as "inner-portion magnets" 920. In the example shown in FIG. 9, the inner portion of the racetrack pattern is formed out of multiple inner-portion magnets 920 included in each of the inner rows 908 (although the inner portion of each inner row 908 can be formed using more or less than the two magnets 920 shown in FIG. 9).

The outer portion substantially surrounds the perimeter of the inner portion. The outer portion of the arrangement 900 comprises a pair of elongated sections 928 that are substantially parallel to one another. In the example shown in FIG. 9, the elongated sections 928 are formed out of multiple magnets 922 in the outer rows 910 (although the elongated sections 928 can be formed using more or less than the four magnets 922 shown in FIG. 9).

The outer portion of the magnet arrangement 900 also comprises a pair of turn-around sections 930. Each turn-around section 930 substantially spans respective ends of the pair of elongated sections 928. In the example shown in FIG. 9, each turn-around section 930 is formed in each inner row 908 using at least one turned magnet 924 (described below) that is located immediately adjacent the nearest inner-portion magnet 920 in that inner row 908 and one or more end magnets 926 that are located at an end of that inner row 908.

In this exemplary magnet arrangement 900, as with the magnet arrangements 400, 500, and 600 described above in connection with FIGS. 4, 5, and 6, the elongated sections 928 formed in the outer rows 910 are longer than the inner portion of the pattern formed in the inner rows 908. This provides space in the inner rows 908 for the turned magnets 924 and the end magnets 926 to form the turn-around sections 930 of the outside portion of the racetrack pattern. The inner portions formed in the inner rows 908 are laterally offset from each other. This results in a stepped turn-around sections 930, where the radius of each turn-around section 930 is reduced.

In this embodiment, for at least one of the rows 906, at least two magnets 902 in that row 906 have respective magnetic poles that do not fall within the same plane (that is, are not co-planar). In the particular example magnet arrangement 900 shown in FIG. 9, one of the magnets (the turned magnets 924) used to implement each turn-around section 930 is "turned" ninety (90) degrees. FIG. 10-A illustrates a cross-section of the magnet arrangement 900 shown in FIG. 9 taken across line 10-A, which includes a cross section of elongated-section magnets 922 from both outer rows 910, and the turned magnets 924 from both of the inner rows 908. FIG. 10-B illustrates a cross-section of the magnet arrangement 900 shown in FIG. 9 taken across line 10-B, which includes a cross section of elongated-section magnets 922 from both outer rows 910, and the inner-portion magnets 920 from both of the inner rows 908.

FIGS. 10-A through 10-E illustrate cross-sections of the exemplary magnet arrangement shown in FIG. 9 taken across lines 10-A through 10-E, respectively. As shown in FIG. 10-A, the direction of the magnetic poles 932 of the elongated-section magnets 922 (which are shown as having a polarity of "S") are 180 degrees out of phase with the direction of the magnetic poles 934 of the inner-portion magnets 920 (which are shown as having a polarity of "N").

As shown in FIGS. 10-B and 10-C, the directions of the magnetic poles 936 of each of the turned magnets 924 is perpendicular to—and not coplanar with—the direction of the magnetic pole 934 of the inner-portion magnets 920 from the same inner row 908. That is, the direction of the magnetic pole 936 of each magnet 924 is turned ninety 90 degrees relative to the direction of the magnetic pole 932 of the respective neighboring elongated-section magnet 922. Also, as shown in FIG. 10-C, the directions of the magnetic poles 936 of the turned magnets 924 in each turnaround section 930 are 180 degrees out of phase with one another (one of which is shown as having a polarity of "N S" and the other of which is shown as having a polarity of "S N").

Also, as shown in FIGS. 10-D and 10-E, the direction of the magnetic poles 938 of the end magnets 926 (which are shown as having a polarity of "S") is the same as the direction of the magnetic poles 932 of the elongated-section magnets 922.

As shown in FIG. 9, the magnets in each turnaround section 930 are arranged to form two or more different curves in the magnetic field formed by the magnets in that turnaround section 930. In some embodiments, at least four different curvers are formed. The curves are formed in a respective at least four different planes (relative to the rotation of the elongated rotatable cylindrical tube in the example shown in FIG. 9). In the embodiment shown in FIG. 9, the magnets in each turnaround section 930 are arranged to form four different curves 950, 952, 954, and 956 in the magnetic field formed by the magnets in that turnaround section 930. More specifically, a first curve 950 is formed across the intersection of one of the elongated-section magnet 922 (which is shown as having a polarity of "S") in a first one of the outer rows 910 and the neighboring turned magnet 924 (which is shown as having a polarity of "S N") in a first one of the inner rows 908, a second curve 952 is formed between that turned magnet 924 and the end magnet 926 (which is shown as having a polarity of "S") in that same first inner row 908, a third curve 954 is formed between that end magnet 926 and the turned magnet 924 (which is shown as having a polarity of "N S") in the other inner row 908, and a fourth curve 956 is formed between that turned magnet 924 and an elongated-section magnet 922 (which is shown as having a polarity of "S") in the other outer row 910. In the example shown in FIG. 9, each of the four curves 950, 952, 954, and 956 is formed between two (or more) magnets having magnetic poles that are turned relative to one another (in particular, turned by at least 90 degrees relative to one another).

Although the curves 950, 952, 954, and 956 are highlighted in FIG. 9 at only one end, it is to be understood that similar curves are formed at the other end.

FIG. 11 illustrates one end of the magnet arrangement 900 of FIG. 9 with the plasma 938 created by the arrangement 900 overlaid thereon. As shown in FIG. 11, as a result of forming four different curves 950, 952, 954, and 956 in the magnetic field formed by the magnets in that turnaround section 930, each corner of the resulting plasma 938 in each turn-around section 930 is broken up into 4 different curves (with the plasma 938 formed over the turned magnets 924, instead of the gap between the rows). Breaking each corner of the plasma 938 into smaller curves reduces the integrated surface area sputtered by each corner as the target rotates, which in turn reduces the target erosion at the turn-around sections 930.

These multiple curves can be created—while still using four straight and separate rows 906—by turning the turned magnets 924 ninety degrees on the axis of the magnet row. This turning of the magnets 924 enables the plasma 938 to shift from the gap between magnet rows 910 and 908 to over the turned magnets 924 thereby creating the extra curves in the magnetic field and resulting plasma 938. Maintaining the staggered pattern enables these curves to be in separate planes in reference to the target rotation. As a result, the target material utilization is typically greatly increased since the turnaround no longer erodes the target before the straightaway of the racetrack pattern. Also, the cross corner effects that otherwise might occur are greatly reduced because the turnaround is strong enough to maintain the Hall current without any significant losses.

It is to be understood that the magnet arrangement 900 shown in FIGS. 9-11 is merely exemplary, and variants of this magnet arrangement 900 can also be implemented. For example, as shown in FIGS. 10-A through 10-E, in this example the end magnets 926 and the turned magnets 924 in the inner rows 908 that are used to form the turn-around sections 930 are of the same cross-sectional dimensions as the inner-portion magnets 920 in the inner rows 908. However, in other embodiments, this need not be the case. Also, the distance by which the magnets are staggered can be changed, and the angle at which the turned magnets 924 face each other can be changed. Also, more generally, the length of the magnets 902 can be changed, the distance between the rows 906 can be changed, in addition to the other variants described above in connect with FIGS. 4-6. Moreover, the end magnets 926 at the very end of the inner rows 908 can also be eliminated. Other variants are possible (for example, at least one of the magnets can have a geometry, size, orientation, or magnetic strength that differs from at least one of the other magnets).

FIG. 12 is a flow diagram of one exemplary embodiment of a method 1200 of sputtering material on a substrate. The example method 1200 shown in FIG. 12 is described here as being implemented in the sputtering system 800 described above in connection with FIG. 8, though it is to be understood that other embodiments can be implemented in other ways.

Method 1200 comprises forming the magnet arrangement 900 shown in FIGS. 9-11 as a part of the magnetron assembly 18 disposed within the elongated rotatable cylindrical tube 16 (block 1202). This can be done by forming the magnet arrangement 900 in a yoke of the type described above.

The method 1200 further comprises mounting the elongated rotatable cylindrical tube 16 in the chamber 10 (block 1204) and maintaining a vacuum in the chamber 10 (block 1206). The method further comprises rotating the elongated rotatable cylindrical tube 16 within the chamber 10 (block 1208), supplying a magnetic flux at the target surface 20 using the magnetron assembly 18 (block 1210), and moving the substrate 12 within the chamber 10 near the target surface 20 (block 1212).

A number of embodiments have been described. Nevertheless, it will be understood that various modifications to the described embodiments may be made without departing from the spirit and scope of the claimed invention. Also, combinations of the individual features of the above-described embodiments are considered within the scope of the inventions disclosed here.

EXAMPLE EMBODIMENTS

Example 1 includes a magnetron assembly comprising: a plurality of magnets; and a yoke configured to hold the plurality of magnets in at least four straight, parallel, independent linear arrays; wherein the plurality of magnets is arranged in the yoke so as to form a pattern comprising an outer portion and an inner portion, wherein the outer portion substantially surrounds the perimeter of the inner portion; wherein the end portions of the linear array comprise a pair of turnaround sections, wherein each turnaround section substantially spans respective ends of the pair of elongated sections of the outer portion; wherein the magnets in each turnaround section are arranged to form at least two or more different curves in the magnetic field that are offset from each along the target rotation axis.

Example 2 includes the magnetron assembly of Example 1, wherein the magnets in each turnaround section are arranged to form at least two or more different curves in the magnetic field that are offset from each along the target rotation axis so resulting target erosion components of each curve do not overlap each other as a target material rotates.

Example 3 includes the magnetron assembly of any of the Examples 1-2, wherein the magnets are arranged in each turnaround section so that each of the at least two or more curves in the magnetic field formed by the magnets in that turnaround section is formed between two magnets having magnetic poles that are turned relative to one another.

Example 4 includes the magnetron assembly of any of the Examples 1-3, wherein the magnets are arranged in each turnaround section so that each of the at least two or more curves in the magnetic field formed by the magnets in that turnaround section is formed between two or more magnets having magnetic poles that are turned at least 90 degrees relative to one another.

Example 5 includes the magnetron assembly of any of the Examples 1-4, wherein the individual linear arrays of magnets are arranged to form a radial pattern, a stair-step pattern, or a flat pattern on the yoke.

Example 6 includes the magnetron assembly of any of the Examples 1-5, wherein at least one of the plurality of magnets has a geometry, size, orientation, or magnetic strength that differs from at least one of the other magnets.

Example 7 includes the magnetron assembly of any of the Examples 1-6, wherein the outer portion of the pattern comprises a pair of turnaround sections, wherein each turnaround section substantially spans respective ends of the pair of elongated sections, and wherein the turnaround sections comprises two or more steps.

Example 8 includes the magnetron assembly of any of the Examples 1-7, wherein the yoke is configured so that the pattern formed by the plurality of magnets can be re-configured without modification to the design of the yoke.

Example 9 includes a sputtering system comprising: a chamber through which a substrate moves; a cathode assembly comprising: an elongated rotatable cylindrical tube mounted in the chamber and having a target surface; and a magnetron assembly positioned within the elongated rotatable cylindrical tube, the magnetron assembly comprising: a plurality of magnets; and a yoke configured to hold the plurality of magnets in at least four straight, parallel, independent linear arrays; wherein the plurality of magnets is arranged in the yoke so as to form a pattern comprising an outer portion and an inner portion, wherein the outer portion substantially surrounds the perimeter of the inner portion; wherein the end portions of the linear array comprise a pair of turnaround sections, wherein each turnaround section substantially spans respective ends of the pair of elongated sections of the outer portion; wherein the magnets in each turnaround section are arranged to form at least two or more different curves in the magnetic field that are offset from each along the target rotation axis.

Example 10 includes the system of Example 9, wherein the magnets in each turnaround section are arranged to form at least two or more different curves in the magnetic field that are offset from each along the target rotation axis so resulting target erosion components of each curve do not overlap each other as the target surface rotates.

Example 11 includes the system of any of the Examples 9-10, wherein the magnets are arranged in each turnaround section so that each of the at least two or more curves in the magnetic field formed by the magnets in that turnaround section is formed between two magnets having magnetic poles that are turned relative to one another.

Example 12 includes the system of any of the Examples 9-11, wherein the magnets are arranged in each turnaround section so that each of the at least two or more curves in the magnetic field formed by the magnets in that turnaround section is formed between two or more magnets having magnetic poles that are turned at least 90 degrees relative to one another.

Example 13 includes the system of any of the Examples 9-12, wherein the individual linear arrays of magnets are arranged to form a radial pattern, a stair-step pattern, or a flat pattern on the yoke.

Example 14 includes the system of any of the Examples 9-13, wherein at least one of the plurality of magnets has a geometry, size, orientation, or magnetic strength that differs from at least one of the other magnets.

Example 15 includes the system of any of the Examples 9-14, wherein the outer portion of the pattern comprises a pair of turnaround sections, wherein each turnaround section substantially spans respective ends of the pair of elongated sections, and wherein the turnaround sections comprises two or more steps.

Example 16 includes the system of any of the Examples 9-15, wherein the yoke is configured so that the pattern formed by the plurality of magnets can be re-configured without modification to the design of the yoke.

Example 17 includes the system of any of the Examples 9-16, further comprising a drive system to support and rotate the elongated rotatable cylindrical tube.

Example 18 includes the system of any of the Examples 9-17, wherein the system is configured to form a plasma within the chamber in connection with depositing a film on the substrate as it moves through the chamber.

Example 19 includes a method of sputtering material on a substrate, the method comprising: forming a pattern of magnets as a part of a magnetron assembly disposed within an elongated rotatable cylindrical tube, wherein the elongated rotatable cylindrical tube comprises a target surface; mounting the elongated rotatable cylindrical tube in a chamber; maintaining a vacuum in the chamber; rotating the elongated rotatable cylindrical tube within the chamber; supplying a magnetic flux at the target surface using the magnetron assembly; and moving the substrate within the chamber near the target surface; wherein the magnetron assembly comprising: a plurality of magnets; and a yoke configured to hold the plurality of magnets in at least four straight, parallel, independent linear arrays; wherein the plurality of magnets is arranged in the yoke so as to form a pattern comprising an outer portion and an inner portion, wherein the outer portion substantially surrounds the perimeter of the inner portion; wherein the end portions of the linear array comprise a pair of turnaround sections, wherein each turnaround section substantially spans respective ends of the pair of elongated sections of the outer portion; and wherein the magnets in each turnaround section are arranged to form at least two or more different curves in the magnetic field that are offset from each along the target rotation axis.

Example 20 includes the method of Example 19, wherein the magnets in each turnaround section are arranged to form at least two or more different curves in the magnetic field that are offset from each along the target rotation axis so resulting target erosion components of each curve do not overlap each other as a target material rotates.

The invention claimed is:

1. A magnetron assembly comprising:
a plurality of magnets configured to produce a plasma confinement path magnetic field; and
a yoke configured to hold the plurality of magnets in at least four straight, parallel, independent linear arrays;
wherein the plurality of magnets is arranged on the yoke so as to form a pattern comprising an outer portion and an inner portion, wherein the outer portion substantially surrounds a perimeter of the inner portion;
wherein end portions of the linear arrays comprise a pair of turnaround sections, wherein each turnaround section substantially spans respective ends of a pair of elongated sections of the outer portion;
wherein the magnetic field produced by the inner portion is coupled to the magnetic field produced by the outer portion to form one continuous plasma confinement path; and
wherein the magnets in each turnaround section are arranged to break up a turnaround curve formed by the one continuous plasma confinement path into two or more different curves that are offset from each other along a target rotation axis.

2. The magnetron assembly of claim 1, wherein the magnets in each turnaround section are arranged so resulting target erosion components of each curve do not overlap each other as a target material rotates.

3. The magnetron assembly of claim 1, wherein the magnets are arranged in each turnaround section so that each of the two or more different curves in the one continuous plasma confinement path in that turnaround section is formed between two magnets having magnetic poles that are turned relative to one another.

4. The magnetron assembly of claim 1, wherein the magnets are arranged in each turnaround section so that each of the two or more different curves in the one continuous plasma confinement path in that turnaround section is formed between two or more magnets having magnetic poles that are turned at least 90 degrees relative to one another.

5. The magnetron assembly of claim 1, wherein the linear arrays of magnets are arranged to form a radial pattern, a stair-step pattern, or a flat pattern on the yoke.

6. The magnetron assembly of claim 1, wherein at least one of the plurality of magnets has a geometry, size, orientation, or magnetic strength that differs from at least one of the other magnets.

7. The magnetron assembly of claim 1, wherein the outer portion of the pattern includes the pair of turnaround sections, wherein each of the turnaround sections comprises two or more steps.

8. The magnetron assembly of claim 1, wherein the yoke is configured so that the pattern formed by the plurality of magnets can be re-configured without modification to the design of the yoke.

9. A sputtering system comprising:
a chamber through which a substrate moves; and
a cathode assembly comprising:
an elongated rotatable cylindrical tube mounted in the chamber and having a target surface; and
a magnetron assembly positioned within the elongated rotatable cylindrical tube, the magnetron assembly comprising:

a plurality of magnets configured to produce a plasma confinement path magnetic field on the target surface; and a yoke configured to hold the plurality of magnets in at least four straight, parallel, independent linear arrays;

wherein the plurality of magnets is arranged on the yoke so as to form a pattern comprising an outer portion and an inner portion, wherein the outer portion substantially surrounds a perimeter of the inner portion;

wherein end portions of the linear arrays comprise a pair of turnaround sections, wherein each turnaround section substantially spans respective ends of a pair of elongated sections of the outer portion;

wherein the magnetic field produced by the inner portion is coupled to the magnetic field produced by the outer portion to form one continuous plasma confinement path; and wherein the magnets in each turnaround section are arranged to break up a turnaround curve formed by the one continuous plasma confinement path into two or more different curves that are offset from each other along a target rotation axis.

10. The system of claim 9, wherein the magnets in each turnaround section are arranged so resulting target erosion components of each curve do not overlap each other as the target surface rotates.

11. The system of claim 9, wherein the magnets are arranged in each turnaround section so that each of the two or more different curves in the one continuous plasma confinement path in that turnaround section is formed between two magnets having magnetic poles that are turned relative to one another.

12. The system of claim 9, wherein the magnets are arranged in each turnaround section so that each of the two or more different curves in the one continuous plasma confinement path in that turnaround section is formed between two or more magnets having magnetic poles that are turned at least 90 degrees relative to one another.

13. The system of claim 9, wherein the linear arrays of magnets are arranged to form a radial pattern, a stair-step pattern, or a flat pattern on the yoke.

14. The system of claim 9, wherein at least one of the plurality of magnets has a geometry, size, orientation, or magnetic strength that differs from at least one of the other magnets.

15. The system of claim 9, wherein the outer portion of the pattern includes the pair of turnaround sections, wherein each of the turnaround sections comprises two or more steps.

16. The system of claim 9, wherein the yoke is configured so that the pattern formed by the plurality of magnets can be re-configured without modification to the design of the yoke.

17. The system of claim 9, further comprising a drive system to support and rotate the elongated rotatable cylindrical tube.

18. The system of claim 9, wherein the system is configured to form a plasma within the chamber in connection with depositing a film on the substrate as it moves through the chamber.

19. A method of sputtering material on a substrate, the method comprising:
   forming a pattern of magnets as a part of a magnetron assembly disposed within an elongated rotatable cylindrical tube, wherein the elongated rotatable cylindrical tube comprises a target surface;
   mounting the elongated rotatable cylindrical tube in a chamber;
   maintaining a vacuum in the chamber;
   rotating the elongated rotatable cylindrical tube within the chamber;
   supplying a magnetic flux at the target surface using the magnetron assembly; and
   moving the substrate within the chamber near the target surface;
   wherein the magnetron assembly comprises:
      a plurality of magnets configured to produce a plasma confinement path magnetic field on the target surface; and
      a yoke configured to hold the plurality of magnets in at least four straight, parallel, independent linear arrays;
      wherein the plurality of magnets is arranged on the yoke so as to form a pattern comprising an outer portion and an inner portion, wherein the outer portion substantially surrounds a perimeter of the inner portion;
      wherein end portions of the linear arrays comprise a pair of turnaround sections, wherein each turnaround section substantially spans respective ends of a pair of elongated sections of the outer portion;
      wherein the magnetic field produced by the inner portion is coupled to the magnetic field produced by the outer portion to form one continuous plasma confinement path; and
      wherein the magnets in each turnaround section are arranged to break up a turnaround curve formed by the one continuous plasma confinement path into two or more different curves that are offset from each other along a target rotation axis.

20. The method of claim 19, wherein the magnets in each turnaround section are arranged so resulting target erosion components of each curve do not overlap each other as a target material rotates.

* * * * *